US012690284B2

(12) United States Patent
Kim

(10) Patent No.: US 12,690,284 B2
(45) Date of Patent: Jul. 21, 2026

(54) IMAGE SENSING DEVICE INCLUDING MULTI-THICKNESS SUBSTRATE

(71) Applicant: SK hynix Inc., Icheon-si (KR)

(72) Inventor: Dong Ha Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 979 days.

(21) Appl. No.: 17/726,786

(22) Filed: Apr. 22, 2022

(65) Prior Publication Data

US 2023/0083209 A1     Mar. 16, 2023

(30) Foreign Application Priority Data

Sep. 16, 2021     (KR) ......................... 10-2021-0123813

(51) Int. Cl.
*H10F 39/00*          (2025.01)

(52) U.S. Cl.
CPC ..... *H10F 39/8027* (2025.01); *H10F 39/8033* (2025.01); *H10F 39/8053* (2025.01); *H10F 39/8063* (2025.01)

(58) Field of Classification Search
CPC ............. H10F 39/8027; H10F 39/8033; H10F 39/8053; H10F 39/8063; H10F 19/75; H10F 30/2635; H10F 39/805; H10F 39/802; H10D 64/64
See application file for complete search history.

(56) References Cited

U.S. PATENT DOCUMENTS

| | | | | |
|---|---|---|---|---|
| 7,312,093 | B2 * | 12/2007 | Ryu ..................... | H10F 39/8053 |
| | | | | 250/214.1 |
| 8,258,560 | B1 * | 9/2012 | Hynecek ............... | H10F 39/182 |
| | | | | 257/292 |
| 9,257,466 | B2 * | 2/2016 | Nagata ................ | H10F 39/8053 |
| 9,601,540 | B2 * | 3/2017 | Takami ................... | H10F 39/18 |
| 10,026,773 | B2 * | 7/2018 | Yanagita ............. | H10F 39/8063 |
| 10,644,073 | B2 * | 5/2020 | Lee ......................... | H04N 23/12 |
| 11,049,892 | B2 * | 6/2021 | Crocherie ........... | H10F 39/8027 |
| 2009/0294886 | A1 | 12/2009 | Hsu et al. | |
| 2012/0001286 | A1 * | 1/2012 | Yoon ..................... | H10F 39/026 |
| | | | | 257/E31.127 |
| 2012/0205765 | A1 * | 8/2012 | Hynecek ............... | H10F 39/026 |
| | | | | 257/E31.127 |

(Continued)

FOREIGN PATENT DOCUMENTS

| | | |
|---|---|---|
| CN | 104051482 A | 9/2014 |
| CN | 104425523 A | 3/2015 |

(Continued)

OTHER PUBLICATIONS

First Office Action for CN Appl. No. 202210415505.9, mailed on Apr. 1, 2026, 15 pages with English translation.

*Primary Examiner* — Ida M Soward
(74) *Attorney, Agent, or Firm* — Perkins Coie LLP

(57) ABSTRACT
An image sensing device includes a semiconductor substrate including photoelectric conversion regions that correspond to unit pixels, respectively, each photoelectric conversion region generating photocharges through conversion of incident light, and a plurality of first color filters disposed over a first surface of the semiconductor substrate to transmit incident light of a first color to the photoelectric conversion regions of first unit pixels. The first unit pixels have different substrate thicknesses from one another.

20 Claims, 13 Drawing Sheets

(56)　　　　　　　References Cited

U.S. PATENT DOCUMENTS

| | | | | |
|---|---|---|---|---|
| 2012/0211851 A1* | 8/2012 | Mori | .................... | H10F 39/199 |
| | | | | 257/E31.127 |
| 2013/0168563 A1* | 7/2013 | Kim | ........................ | G01T 1/16 |
| | | | | 250/370.06 |
| 2014/0175586 A1* | 6/2014 | Kim | ................... | H10F 39/8053 |
| | | | | 257/432 |
| 2014/0264690 A1* | 9/2014 | Nagata | ............... | H10F 39/8033 |
| | | | | 438/70 |
| 2015/0061063 A1* | 3/2015 | Kim | .................... | H10F 39/024 |
| | | | | 257/443 |
| 2016/0247844 A1* | 8/2016 | Kim | .................... | H10F 39/182 |
| 2017/0141149 A1* | 5/2017 | Lee | .................... | H10F 39/182 |
| 2018/0047766 A1* | 2/2018 | Pyo | ................... | H10F 39/8023 |
| 2020/0249382 A1* | 8/2020 | Lin | ....................... | G02B 5/201 |
| 2022/0077211 A1* | 3/2022 | Cho | ................... | H10F 39/8053 |

FOREIGN PATENT DOCUMENTS

| | | | | | |
|---|---|---|---|---|---|
| CN | 114156291 | A | | 3/2022 | |
| JP | 2008041779 | A * | 2/2008 | .............. | G02B 5/20 |
| KR | 20060010899 | A | | 2/2006 | |
| KR | 20060077190 | A * | 7/2006 | ........ | H10F 39/8063 |
| KR | 20150004598 | A | | 1/2015 | |
| TW | 1390722 | B * | 3/2013 | ........... | H10F 39/802 |

* cited by examiner $$y = -0.026x^2 + 0.2606x + 0.3733$$

PB_R                    PB_Gr

| 172 | 189 | 270 | 291 |
| 175 | 185 | 276 | 295 |
| 290 | 298 | 191 | 194 |
| 294 | 293 | 196 | 192 |

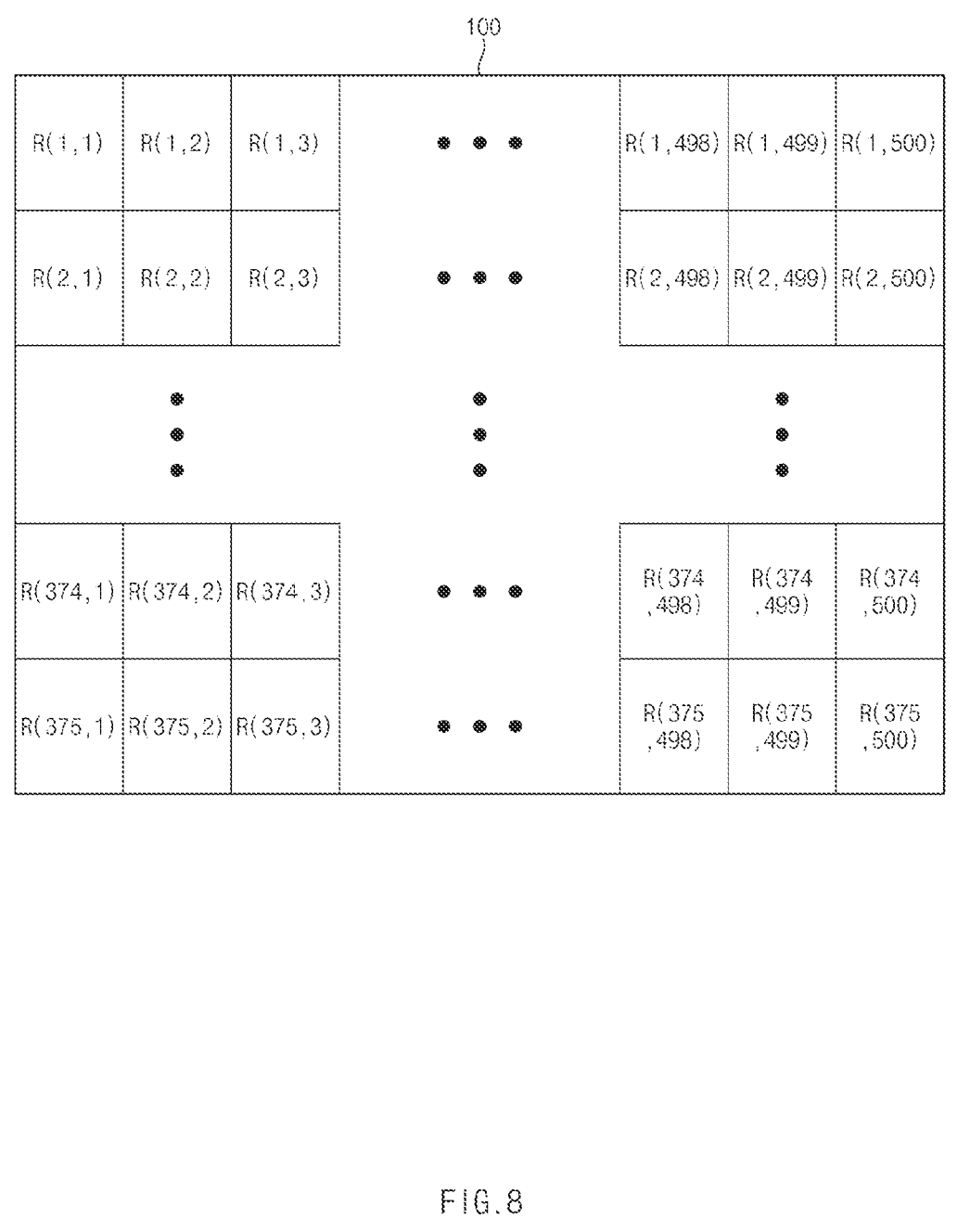

| R(1,1) | R(1,2) | R(1,3) | ● ● ● | R(1,498) | R(1,499) | R(1,500) |
| R(2,1) | R(2,2) | R(2,3) | ● ● ● | R(2,498) | R(2,499) | R(2,500) |
| ● ● ● | | | ● ● ● | | | ● ● ● |
| R(374,1) | R(374,2) | R(374,3) | ● ● ● | R(374 ,498) | R(374 ,499) | R(374 ,500) |
| R(375,1) | R(375,2) | R(375,3) | ● ● ● | R(375 ,498) | R(375 ,499) | R(375 ,500) |

FIG.8

IMAGE SENSING DEVICE INCLUDING MULTI-THICKNESS SUBSTRATE

CROSS-REFERENCE TO RELATED APPLICATION

This patent document claims the priority and benefits of Korean patent application No. 10-2021-0123813, filed on Sep. 16, 2021, which is incorporated by reference in its entirety as part of the disclosure of this patent document.

TECHNICAL FIELD

The technology and implementations disclosed in this patent document generally relate to an image sensing device.

BACKGROUND

An image sensor is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

SUMMARY

Various embodiments of the disclosed technology relate to an image sensing device in which imbalance of pixel signals is resolved.

In one aspect, an image sensing device is provided to include a semiconductor substrate including photoelectric conversion regions that correspond to unit pixels, respectively, each photoelectric conversion region generating photocharges through conversion of incident light, and a plurality of first color filters disposed over a first surface of the semiconductor substrate to transmit incident light of a first color to the photoelectric conversion regions of first unit pixels. The first unit pixels have different substrate thicknesses from one another.

In another aspect, an image sensing device is provided to include a pixel array including a plurality of sub-pixel blocks, each sub-pixel block including a plurality of unit pixels configured to generate photocharges through photoelectric conversion of incident light corresponding to a certain color. The plurality of unit pixels of the sub-pixel block includes photoelectric conversion regions that are located within a substrates to perform the photoelectric conversion of the incident light and have different thicknesses from one another.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

FIG. 6 is a diagram illustrating signal values of the unit pixels of sub-pixel blocks obtained through a test based on some implementations of the disclosed technology.

FIG. 8 is a diagram illustrating an example of a planar structure of an image sensing device based on another embodiment of the disclosed technology.

DETAILED DESCRIPTION

This patent document provides implementations and examples of an image sensing device and the disclosed features may be implemented to achieve one or more advantages in more applications. Some implementations of the disclosed technology suggest designs of an image sensing device in which imbalance of pixel signals is resolved. The disclosed technology provides various implementations of an image sensing device which can prevent imbalance of pixel signals by adjusting a thickness of a substrate with respect to a plurality of adjacent unit pixels having the same color.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Figure 1:
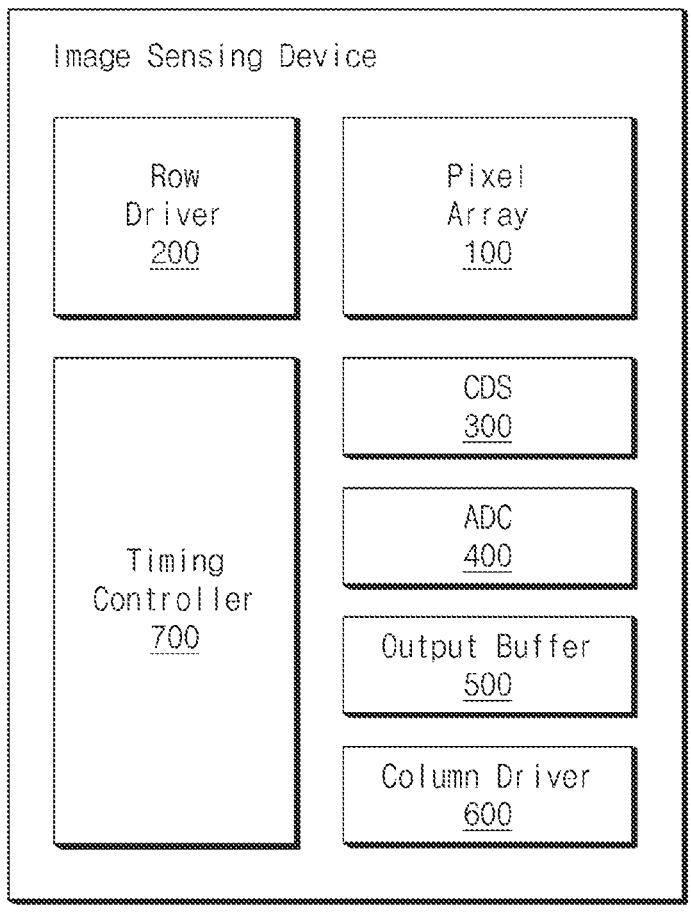
FIG. 1 is a block diagram illustrating an example of an image sensing device based on some implementations of the disclosed technology.
Figure 2:
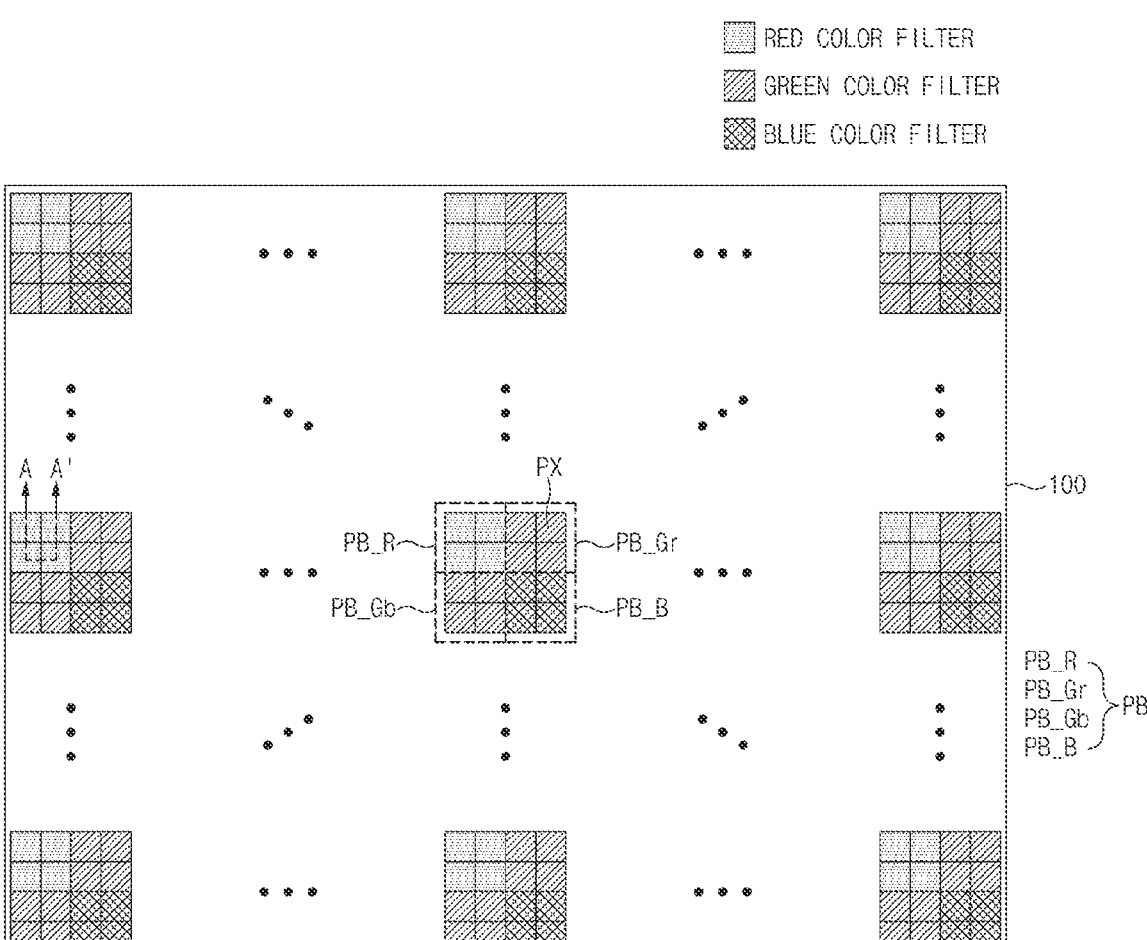
FIG. 2 is a perspective view schematically illustrating an example of a layout structure of a pixel array shown in FIG. 1 based on some implementations of the disclosed technology.

FIG. 1 is a block diagram illustrating an image sensing device based on some implementations of the disclosed technology. FIG. 2 is a perspective view schematically illustrating an example of a layout structure of a pixel array 100 shown in FIG. 1 based on some implementations of the disclosed technology.

Referring to FIGS. 1 and 2, the image sensing device may include a pixel array 100, a row driver 200, a correlated double sampler (CDS) 300, an analog-digital converter (ADC) 400, an output buffer 500, a column driver 600 and a timing controller 700. The components of the image sensing device illustrated in FIG. 1 are discussed by way of example only, and this patent document encompasses numerous other changes, substitutions, variations, alterations, and modifications.

The pixel array 100 may include a plurality of pixel blocks (PBs) consecutively arranged in a two-dimensional (2D) structure in which the pixel blocks (PBs) are arranged in row and column directions. In one example, the plurality of pixel blocks (PBs) can be arranged in a two dimensional (2D) pixel array including rows and columns. Each pixel block (PB) may be configured to include a plurality of adjacent sub-pixel blocks with different color filters for sensing colors in the incident light. In some implementations, for example, red green and blue transmitting color filters can be used to include a sub-pixel block PB_R for sensing red light in the incident light, a sub-pixel block PB_Gr for sensing green light in the incident light, a sub-pixel block PB_Gb for another color filter sensing green light in the incident light, and a sub-pixel block PB_B for sensing blue light in the incident light arranged in a Bayer pattern with color filter pattern for transmitting 25% red, 25% blue, and 50% green to detect both the intensity and color of the incident light received at each pixel block.

Each of the sub-pixel blocks PB_R, PB_Gr, PB_Gb, and PB_B may include a plurality of unit pixels (PXs) configured to generate electrical signals (pixel signals) corresponding to incident light through photoelectric conversion of the incident light received from the outside. In this case, each of the sub-pixel blocks PB_R, PB_Gr, PB_Gb, and PB_B may include a structure in which the unit pixels (PXs) having color filters of the same color are arranged adjacent to each other in an (N×N) array (where, N is a natural number of 2 or greater). In some implementations, the pixel array 100 may include sub-pixel blocks PB_R, PB_Gr, PB_Gb, and PB_B, each of which has a quad structure in which four unit pixels having the same color are arranged in a (2×2) array. For example, the sub-pixel blocks (PB_R) may include four red color pixels, each of which filters out visible light having a first wavelength, arranged in a (2×2) array indicating a quad structure. Each of the sub-pixel blocks PB_Gr and PB_Gb may include four green color pixels, each of which filters out visible light having a second wavelength shorter than the first wavelength, arranged in a (2×2) array indicating a quad structure. The sub-pixel blocks (PB_B) may include four blue color pixels, each of which filters out visible light having a third wavelength shorter than the second wavelength, arranged in a (2×2) array indicating a quad structure.

Since each sub-pixel block PB_R, PB_Gr, PB_Gb, or PB_B includes a plurality of pixels having the same color, it may be desired that unit pixels contained in the same sub-pixel block PB_R, PB_Gr, PB_Gb, or PB_B have the same optical characteristics (e.g., light sensitivity) to prevent imbalance of signals. To help the unit pixels of each sub-pixel block PB_R, PB_Gr, PB_Gb, or PB_B to have the same optical characteristics, the image sensing device based on some implementations of the disclosed technology may adjust a substrate thickness for each of the unit pixels (PXs) included in the same sub-pixel block PB_R, PB_Gr, PB_Gb, or PB_B. By doing so, the corresponding unit pixels belonging to the same sub-pixel block are configured to have the same optical characteristics. How to adjust the substrate thickness for each of the unit pixels (PXs) included in the same sub-pixel block PB_R, PB_Gr, PB_Gb, or PB_B will be described later in this patent document.

The pixel array 100 may receive driving signals (for example, a row selection signal, a reset signal, a transmission (or transfer) signal, etc.) from the row driver 200. Upon receiving the driving signal, the unit pixels may be activated to perform the operations corresponding to the row selection signal, the reset signal, and the transfer signal.

The row driver 200 may activate the pixel array 100 to perform certain operations on the unit pixels in the corresponding row based on control signals provided by controller circuitry such as the timing controller 700. In some implementations, the row driver 200 may select one or more pixel groups arranged in one or more rows of the pixel array 100. The row driver 200 may generate a row selection signal to select one or more rows from among the plurality of rows. The row driver 200 may sequentially enable the reset signal and the transfer signal for the unit pixels arranged in the selected row. The pixel signals generated by the unit pixels arranged in the selected row may be output to the correlated double sampler (CDS) 300.

The correlated double sampler (CDS) 300 may remove undesired offset values of the unit pixels using correlated double sampling. In one example, the correlated double sampler (CDS) 300 may remove the undesired offset values of the unit pixels by comparing output voltages of pixel signals (of the unit pixels) obtained before and after photocharges generated by incident light are accumulated in the sensing node (i.e., a floating diffusion (FD) node). As a result, the CDS 300 may obtain a pixel signal generated only by the incident light without causing noise. In some implementations, upon receiving a clock signal from the timing controller 700, the CDS 300 may sequentially sample and hold voltage levels of the reference signal and the pixel signal, which are provided to each of a plurality of column lines from the pixel array 100. That is, the CDS 300 may sample and hold the voltage levels of the reference signal and the pixel signal which correspond to each of the columns of the pixel array 100. In some implementations, the CDS 300 may transfer the reference signal and the pixel signal of each of the columns as a correlate double sampling (CDS) signal to the ADC 400 based on control signals from the timing controller 700.

The ADC 400 is used to convert analog CDS signals received from the CDS 300 into digital signals. In some implementations, the ADC 400 may be implemented as a ramp-compare type ADC. The analog-to-digital converter (ADC) 400 may compare a ramp signal received from the timing controller 700 with the CDS signal received from CDS 300, and may thus output a comparison signal indicating the result of comparison between the ramp signal and the CDS signal. The analog-to-digital converter (ADC) 400 may count a level transition time of the comparison signal in response to the ramp signal received from the timing controller 700, and may output a count value indicating the counted level transition time to the output buffer 500.

The output buffer 500 may temporarily store column-based image data provided from the ADC 400 based on control signals of the timing controller 700. The image data received from the ADC 400 may be temporarily stored in the output buffer 50 based on control signals of the timing controller 700. The output buffer 500 may provide an interface to compensate for data rate differences or transmission rate differences between the image sensing device and other devices.

The column driver 600 may select a column of the output buffer 500 upon receiving a control signal from the timing controller 700, and sequentially output the image data, which are temporarily stored in the selected column of the output buffer 500. In some implementations, upon receiving an address signal from the timing controller 700, the column driver 600 may generate a column selection signal based on the address signal, may select a column of the output buffer 500 using the column selection signal, and may control the image data received from the selected column of the output buffer 500 to be output as an output signal.

The timing controller 700 may generate signals for controlling operations of the row driver 200, the ADC 400, the output buffer 500 and the column driver 600. The timing controller 700 may provide the row driver 200, the column driver 600, the ADC 400, and the output buffer 500 with a clock signal required for the operations of the respective components of the image sensing device, a control signal for timing control, and address signals for selecting a row or column. In some implementations, the timing controller 700 may include a logic control circuit, a phase lock loop (PLL) circuit, a timing control circuit, a communication interface circuit and others.

Figure 3:
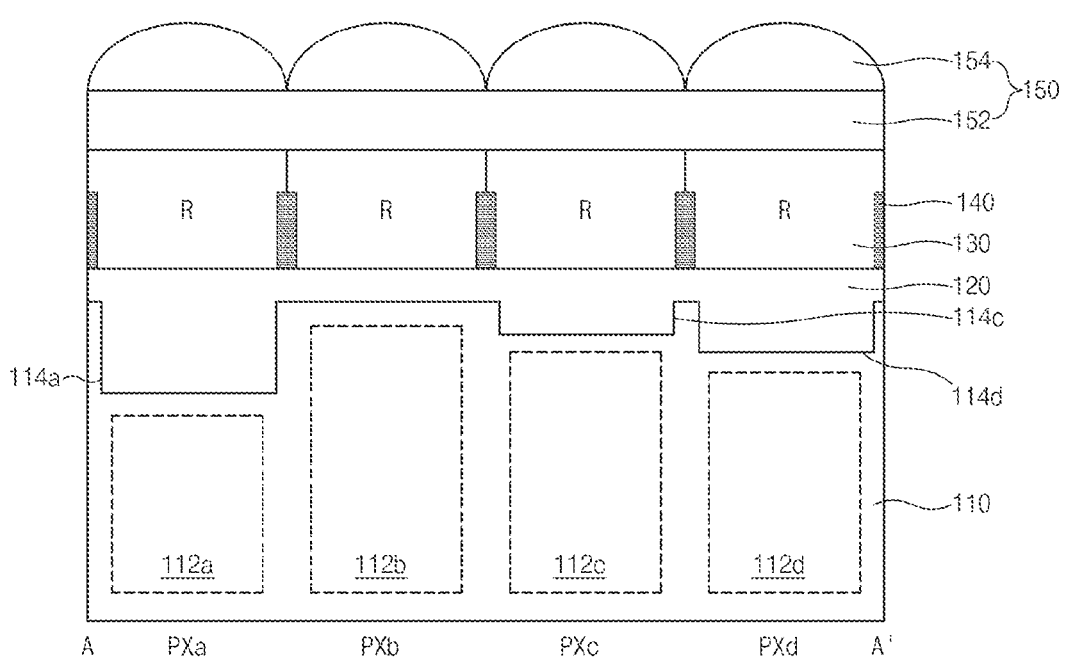
FIG. 3 is a cross-sectional view illustrating an example of a pixel array taken along the line A-A' shown in FIG. 2 based on some implementations of the disclosed technology.

FIG. 3 is a cross-sectional view illustrating an example of the pixel array 100 taken along the line A-A' shown in FIG. 2 based on some implementations of the disclosed technology.

Referring to FIG. 3, a semiconductor substrate 110 may include a first surface upon which light is incident, and a second surface facing or opposite to the first surface. The semiconductor substrate 110 may include a monocrystalline silicon material. The semiconductor substrate 110 may include photoelectric conversion regions 112a, 112b, 112c, and 112d formed to respectively correspond to the unit pixels, PXa, PXb, PXc, and PXd. The unit pixels, PXa, PXb, PXc, and PXd, may have corresponding regions formed in the semiconductor substrate 110. The photoelectric conversion regions 112a, 112b, 112c, and 112d may generate photocharges through photoelectric conversion of incident light that is filtered by the color filter layer 130.

In some implementations, the unit pixel PXa, the unit pixel PXb, the unit pixel PXc, and the unit pixel PXd contained in each of the sub-pixel blocks PB_R, PB_Gr, PB_Gb, and PB_B may be formed to have different substrate thicknesses from each other. For example, in each of the sub-pixel blocks PB_R, PB_Gr, PB_Gb, and PB_B, the corresponding unit pixels PXa, PXb, PXc, and PXd may be formed to have different substrate thicknesses in a manner that the unit pixels PXa~PXd included in the corresponding sub-pixel block have the same light sensitivity. Although FIG. 3 illustrates only a cross-sectional structure of the sub-pixel block (PB_R) for convenience of description, it should be noted that in other sub-pixel blocks PB_Gr, PB_Gb, and PB_B, substrate thicknesses of the unit pixel PXa~PXd are different from each other in the same manner as in the sub-pixel blocks PB_R.

The substrate thickness of each of the unit pixels PXa to PXd can be determined through simulations using algorithms. For example, a simulation is performed to acquire information about the relationship between a light sensitivity change based on a substrate thickness for each colored light. Such information may be represented using a graph showing the light sensitivity change according to the substrate thickness change. The simulation also can be performed to measure signal values of the unit pixels PXa~PXd for each sub-pixel block PB_R, PB_Gr, PB_Gb, or PB_B using a test device. A substrate thickness of each of the unit pixels PXa~PXd can be determined based on the measured signal values and the information about the relationship between the substrate thickness and the light sensitivity change, which are obtained through the simulations.

In order to allow the semiconductor substrate 110 to be formed with different thicknesses, trenches 114a, 114c, and 114d having different depths may be formed in the regions corresponding to the unit pixels PXa~PXd within the semiconductor substrate 110 of each of the sub-pixel blocks PB_R, PB_Gr, PB_Gb, and PB_B. As the depths of the trenches 114a, 114c, and 114d are adjusted or determined as described above, the unit pixels PXa~PXd may have different thicknesses of the semiconductor substrate.

When the substrate thicknesses of the unit pixels PXa~PXd are adjusted or set to be different from each other as described above, the size (volume) of each of the photoelectric conversion regions 112a, 112b, 112c, and 112d of the unit pixels PXa, PXb, PXc, and PXd can be adjusted or set as well. Then, the amounts of light absorbed by the respective unit pixels PXa~PXd may be different from each other during the same exposure time. As a result, the unit pixels PXa~PXd may have the same light sensitivity.

Each of the trenches 114a, 114c, and 114d may be formed to be etched to a corresponding depth from the first surface, and an anti-reflection layer 120 may be formed in the trenches 114a, 114c, and 114d. In addition, the anti-reflection layer 120 may be formed to extend over the first surface of the semiconductor substrate 110. The anti-reflection layer 120 may include any one monolayer structure selected from a group consisting of an oxide layer, a nitride layer, and/or an oxynitride layer, or may include a multilayer structure formed by stacking two or more layers. Although FIG. 3 shows that some unit pixels PXa, PXc, PXd have the corresponding trench 114a, 114c, 114d, it is also possible that each of the unit pixels PXa to PXd has a trenche. In this case, the unit pixels PXa to PXd can still have different thicknesses by determining the thicknesses of trenches of other unit pixels to be different from each other.

The color filter layer 130 may be formed over the anti-reflection layer 120. The color filter layer 130 may include a plurality of color filters (i.e., RGB color filters), each of which is formed to selectively filter only visible light having a specific color from among incident light and transmit the filtered light to the corresponding photoelectric conversion elements 112a, 112b, 112c, and 112d. In more detail, the color filter layer 130 including a plurality of red color filters (Rs), a plurality of green color filters (Gs), and a plurality of blue color filters (Bs) may perform filtering of incident light, and may thus selectively transmit visible light (e.g., red light, green light, or blue light) at a certain wavelength while blocking light at other wavelengths. Each of the color filters R, G, and B may be formed per unit pixel (PX). The red color filters (R) may include a polymer organic material including a red pigment, the green color filters (G) may include a polymer organic material including a green pigment, and the blue color filters (B) may include a polymer organic material including a blue pigment. For example, each of the color filters R, G, and B may include a resist material. FIG. 3 is a cross-sectional view illustrating an example of the sub-pixel block (PB_R), and only the red color filters (Rs) are shown in FIG. 3 for convenience of description and better understanding of the disclosed technology.

The grid structure 140 may define regions in which the color filters R, G, and B are formed, and may be formed between the color filters R, G, and B of the adjacent unit pixels PXa~PXd, thereby preventing crosstalk between the adjacent color filters R, G, and B.

The lens layer 150 may include an over-coating layer 152 and a plurality of microlenses 154. The over-coating layer 152 and the microlenses 154 may be formed of the same materials. The over-coating layer 152 may be formed over the color filter layer 130. The over-coating layer 152 may operate as a planarization layer to compensate for (or remove) a step difference caused by the color filter layer 130. The microlenses 154 may be formed over the over-coating layer 152. Each of the microlenses 154 may be formed in a hemispherical shape, and may be formed per unit pixel (PX). The microlenses 154 may converge incident light, and may transmit the converged light to the corresponding color filters R, G, and B.

Figure 4:
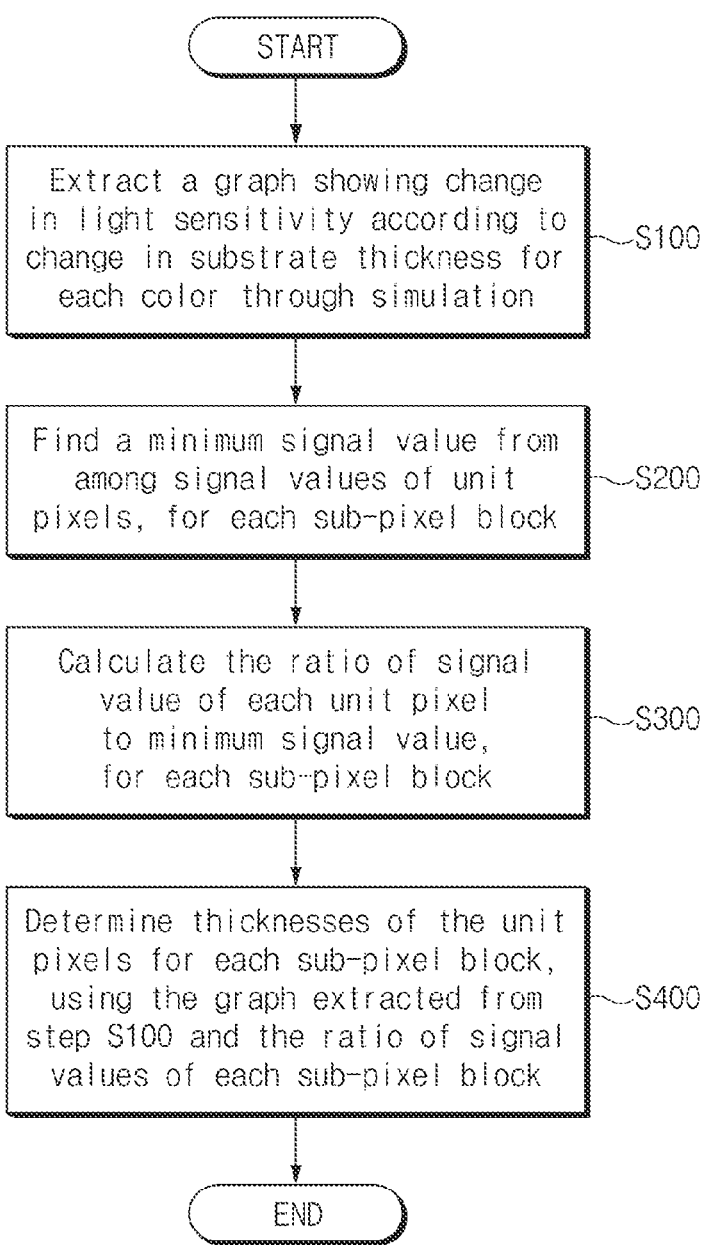
FIG. 4 is a flowchart illustrating an example of a method for determining a substrate thickness for each unit pixel within a sub-pixel block based on some implementations of the disclosed technology.
Figure 5A:
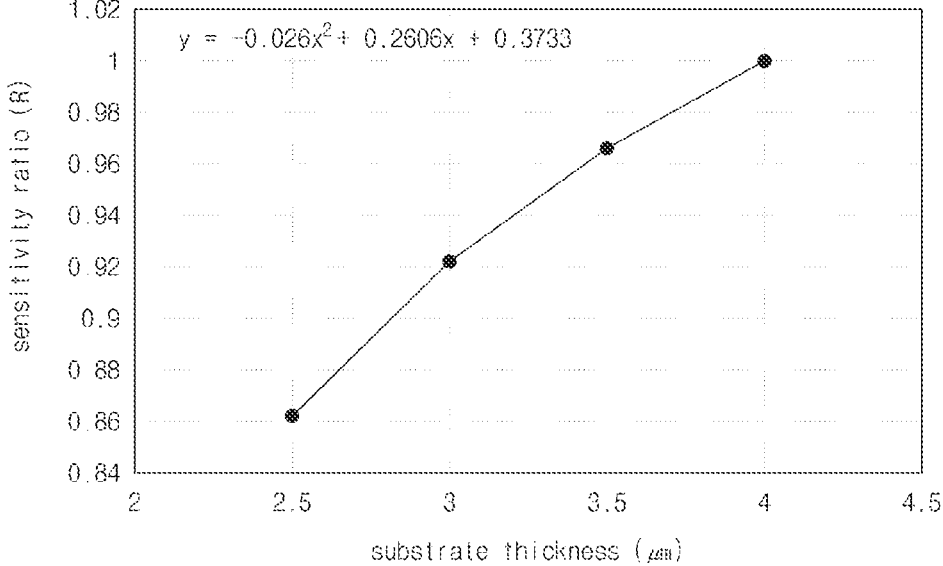
FIG. 5A is a diagram illustrating an example of a graph of a change in light sensitivity of red color (R) extracted through the simulation result based on some implementations of the disclosed technology.
Figure 5B:
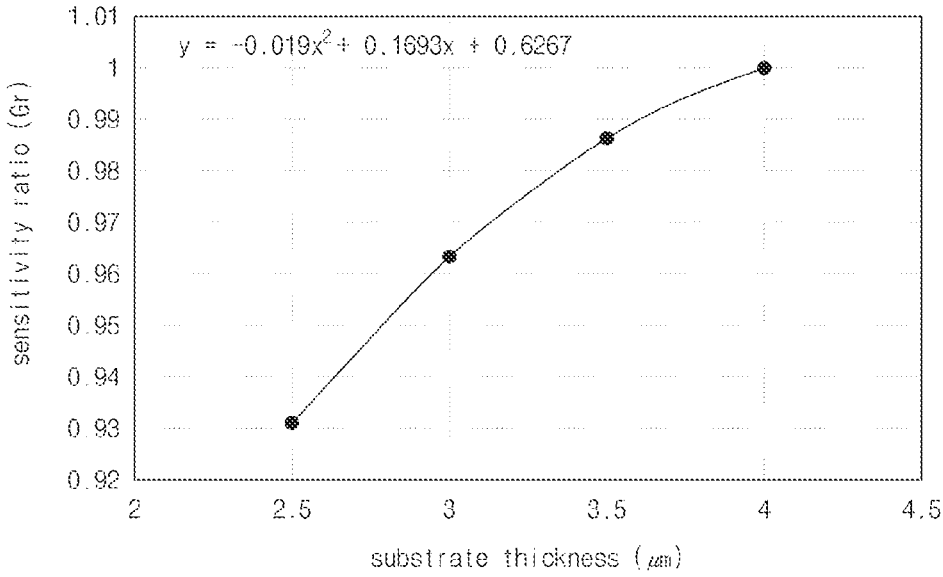
FIG. 5B is a diagram illustrating an example of a graph of a change in light sensitivity of green color (Gr) extracted through the simulation result based on some implementations of the disclosed technology.
Figure 5C:
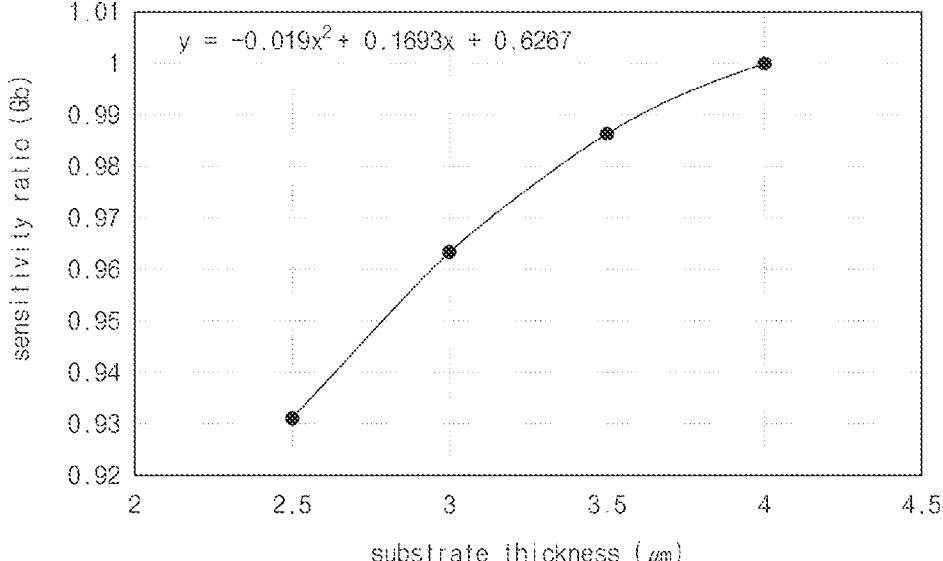
FIG. 5C is a diagram illustrating an example of a graph of a change in light sensitivity of green color (Gb) extracted through the simulation result based on some implementations of the disclosed technology.
Figure 5D:
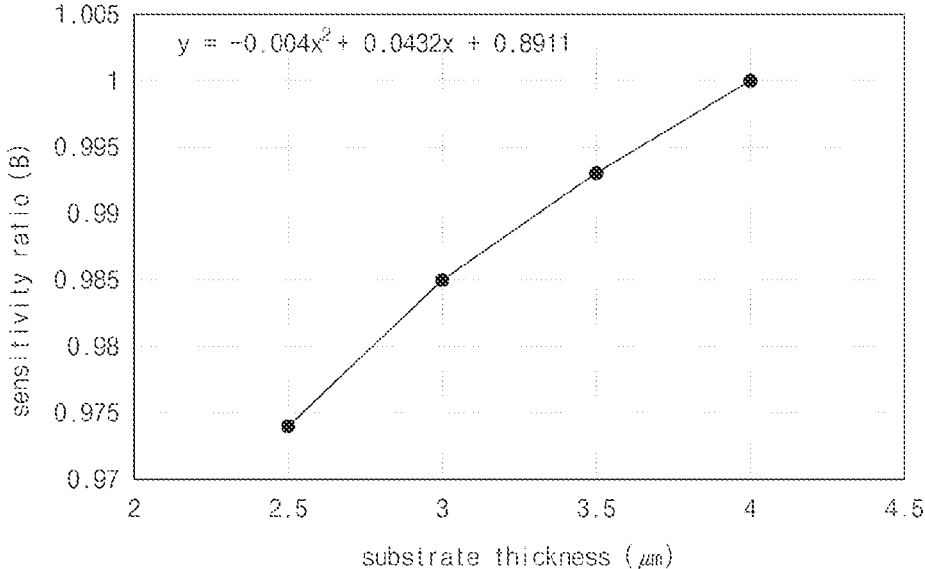
FIG. 5D is a diagram illustrating an example of a graph of a change in light sensitivity of blue color (B) extracted through the simulation result based on some implementations of the disclosed technology.

FIG. 4 is a flowchart illustrating an example of a method for determining a substrate thickness for each unit pixel within a sub-pixel block. FIG. 5A is a diagram illustrating an example of a graph of a change in light sensitivity of red color (R) extracted through the simulation result. FIG. 5B is a diagram illustrating an example of a graph of a change in light sensitivity of green color (Gr) extracted through the simulation result. FIG. 5C is a diagram illustrating an example of a graph of a change in light sensitivity of green color (Gb) extracted through the simulation result. FIG. 5D is a diagram illustrating an example of a graph of a change in light sensitivity of blue color (B) extracted through the simulation result. FIG. 6 is a diagram illustrating signal values of the unit pixels of sub-pixel blocks obtained through a test.

Referring to FIG. 4, the design system (not shown) may extract or obtain a graph illustrating a light sensitivity change according to a substrate thickness change for each color through simulation (S100). The design system may employ various algorithms to perform the operations/simulations discussed with reference to FIG. 4.

For example, the design system may acquire a signal value (light sensitivity) in a state in which a substrate thickness of the unit pixel of the red color (R) is set to 4 µm using the simulation program, may gradually reduce the substrate thickness of 4 µm by a predetermined value (e.g., 0.5 µm), and at the same time may acquire signal values for the corresponding thickness. Using the obtained signal values, the design system may obtain a graph showing the ratio of light sensitivity to substrate thickness with respect to the unit pixel having the red color (R) as shown in FIG. 5A.

The design system may obtain a graph that represents the ratio of light sensitivity to substrate thickness with respect to each of the green unit pixels Gr and Gb as shown in FIGS. 5B and 5C using the similar technique used for the unit pixel of the red color R. In addition, the design system may obtain a graph that represents the ratio of light sensitivity to substrate thickness with respect to the blue unit pixel (B) as shown in FIG. 5D. The green color (Gr) and the other green color (Gb) may be considered to be the same green color although they are depicted to distinguish between one green color located next to the red color (R) in the Bayer pattern and the other green color located next to the blue color (B)

in the Bayer pattern. Thus, the graphs obtained through step S100 may be identical to each other as shown in FIGS. 5B and 5C.

In some implementations, although the substrate thickness of 4 µm is used as a base value (i.e., the sensitivity ratio of 1), this is because a base substrate thickness of the image sensing device to be actually manufactured is set to 4 µm. Therefore, a substrate thickness to be used as the base value may vary depending on the basic substrate thickness of the image sensing device to be actually manufactured.

Subsequently, the design system may find a minimum signal value from among signal values of the unit pixels included in each of the sub-pixel blocks PB_R, PB_Gr, PB_Gb, and PB_B (S200).

For example, the design system may photograph (or capture) an image of a target object using an image sensor manufactured for testing, so that the design system can obtain the signal values actually measured for the unit pixels for each of the sub-pixel blocks PB_R, PB_Gr, PB_Gb, and PB_B as illustrated in FIG. 6. The design system can search for one unit pixel (i.e., a minimum pixel) having the smallest signal value in each of the sub-pixel blocks PB_R, PB_Gr, PB_Gb, and PB_B using the obtained signal values. As a result, as can be seen from FIG. 6, a minimum signal value of the sub-pixel block PB_R is 172, a minimum signal value of the sub-pixel block PB_Gr is 270, a minimum signal value of the sub-pixel block PB_Gb is 290, and a minimum signal value of the sub-pixel block PB_B is 191.

Subsequently, the design system may calculate the ratio of signal value of each unit pixel to the minimum signal value for each of the sub-pixel blocks PB_R, PB_Gr, PB_Gb, and PB_B (S300), and may respectively apply the calculated ratios of signal values of the unit pixels to the minimum signal values of the sub-pixel blocks PB_R, PB_Gr, PB_Gb, and PB_B to graphs shown in FIGS. 5A, 5B, 5C and 5D, thereby finding a substrate thickness corresponding to the corresponding signal value (S400).

For example, Table 1 shows the result of calculating the ratio of signal values for each unit pixel using signal values of the unit pixels of the sub-pixel block (PB_R) shown in FIG. 6, and further shows substrate thicknesses determined using the calculated ratio of signals values.

TABLE 1

| Signal values of PB_R unit pixels | Minimum signal value/ Unit-pixel signal value (Y-axis) | Substrate thickness (X-axis) |
|---|---|---|
| 189 | 172/189 = 0.910 | 2.89 µm |
| 172 | 1.000 | 4 µm (Base) |
| 185 | 0.930 | 3.08 µm |
| 175 | 0.983 | 3.71 µm |

In Table 1, in association with each of the unit pixels of the sub-pixel block (PB_R), the design system may divide a minimum signal value 172 of the sub-pixel block (PB_R) by each of signal values 189, 172, 185, and 175 of the respective unit pixels, so that the design system can calculate the ratio of a signal value for each unit pixel based on the result of division.

Thereafter, the design system may find a substrate thickness by applying the calculated ratios of signal values of the respective unit pixels to the graph shown in FIG. 5A. For example, as can be seen from FIG. 5A, the design system may find an X-axis value by which the ratio of each signal value calculated in step S300 is set to a Y-axis value, so that the corresponding X-axis value may be determined to be a substrate thickness of the corresponding unit pixel.

Table 2 shows the result of calculating the ratio of signal values for each unit pixel using signal values of the unit pixels of the sub-pixel block (PB_Gr) shown in FIG. 6, and further shows substrate thicknesses determined using the calculated ratio of signals values. Table 3 shows the result of calculating the ratio of signal values for each unit pixel using signal values of the unit pixels of the sub-pixel block (PB_Gb) shown in FIG. 6, and further shows substrate thicknesses determined using the calculated ratio of signals values. Table 4 shows the result of calculating the ratio of signal values for each unit pixel using signal values of the unit pixels of the sub-pixel block (PB_B) shown in FIG. 6, and further shows substrate thicknesses determined using the calculated ratio of signals values.

TABLE 2

| Signal values of PB_Gr unit pixels | Minimum signal value/ Unit-pixel signal value (Y-axis) | Substrate thickness (X-axis) |
|---|---|---|
| 291 | 270/291 = 0.928 | 2.45 μm |
| 270 | 1.000 | 4 μm (Base) |
| 295 | 0.915 | 2.29 μm |
| 276 | 0.978 | 3.28 μm |

TABLE 3

| Signal values of PB_Gb unit pixels | Minimum signal value/ Unit-pixel signal value (Y-axis) | Substrate thickness (X-axis) |
|---|---|---|
| 298 | 290/298 = 0.973 | 3.16 μm |
| 290 | 1.000 | 4 μm (Base) |
| 293 | 0.990 | 3.58 μm |
| 294 | 0.986 | 3.47 μm |

TABLE 4

| Signal values of PB_B unit pixels | Minimum signal value/ Unit-pixel signal value (Y-axis) | Substrate thickness (X-axis) |
|---|---|---|
| 194 | 191/194 = 0.985 | 3 μm |
| 191 | 1.000 | 4 μm (Base) |
| 196 | 0.974 | 2.5 μm |
| 192 | 0.995 | 3.55 μm |

As shown in Tables 2, 3, and 4, even when using the sub-pixel block (PB_Gr), the sub-pixel block (PB_Gb), and the sub-pixel block (PB_B), the design system can determine a substrate thickness for each of the unit pixels in the same manner as in the sub-pixel block (PB_R).

The above-described steps S100 to S400 may be performed in all effective sub-pixel blocks (PB_R, PB_Gr, PB_Gb, PB_B) included in the pixel array 100.

As described above, in the present example, the design system for the image sensing device may adjust or determine a substrate thickness for each of other unit pixels by referring to a unit pixel having a minimum signal value for each of sub-pixel blocks PB_R, PB_Gr, PB_Gb, and PB_B. Thus, a unit pixel having a minimum signal value within each of the sub-pixel blocks PB_R, PB_Gr, PB_Gb, and PB_B may not include trenches shown in FIG. 3, while the remaining unit pixels of each of the sub-pixel blocks PB_R, PB_Gr, PB_Gb, and PB_B may be formed to have trenches.

Figure 7A:
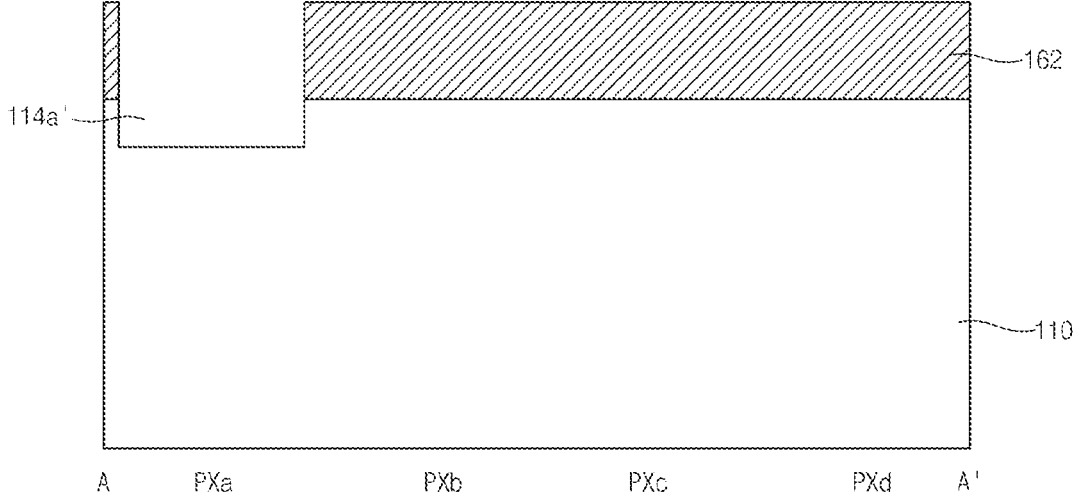
FIGS. 7A to 7C are cross-sectional views illustrating examples of a method for forming trenches having different depths shown in FIG. 3 based on some implementations of the disclosed technology.
Figure 7B:
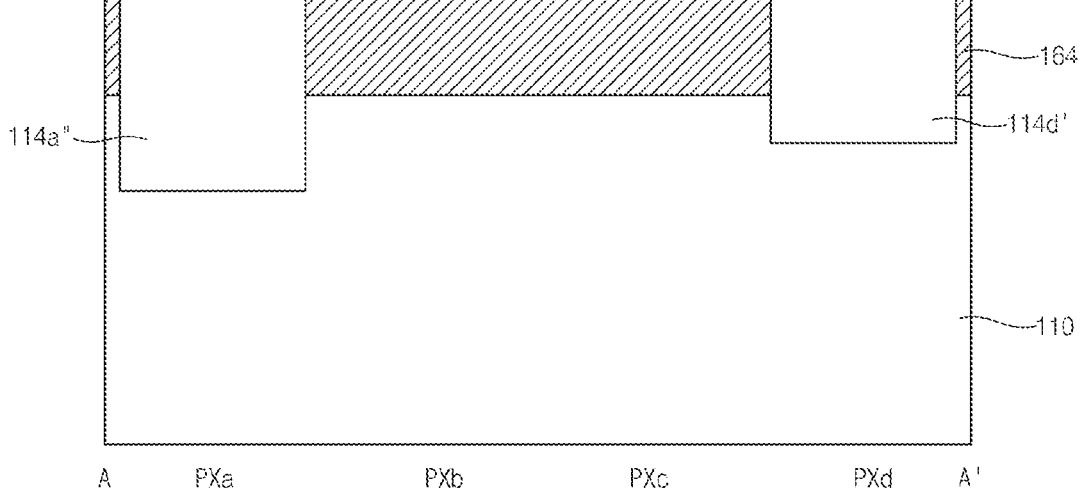
Figure 7C:
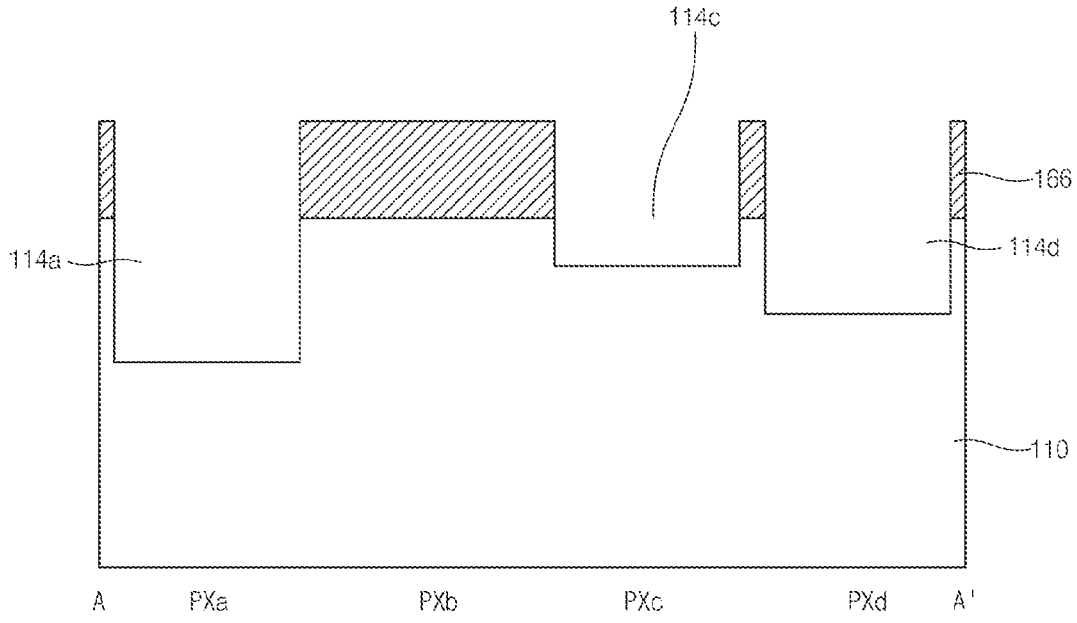

FIGS. 7A to 7C are cross-sectional views illustrating examples of a method for forming trenches having different depths shown in FIG. 3 based on some implementations of the disclosed technology. For convenience of description and better understanding of the disclosed technology, only one sub-pixel block (PX_R) will hereinafter be described with reference to FIGS. 7A to 7C.

Referring to FIG. 7A, a mask pattern 162 for opening a region where the unit pixel (PXa) is to be formed may be formed over the first surface of the semiconductor substrate 110. For example, the mask pattern 162 may be formed over the semiconductor substrate 110 to expose only a region of the unit pixel (PXa) where the substrate should have a first thickness (i.e., the smallest thickness) in the corresponding sub-pixel block (PX_R), based on the substrate thicknesses determined through the above-described steps S100 to S400 for the specific sub-pixel block (PX_R). In this case, the mask pattern 162 may include a photoresist pattern.

Subsequently, the semiconductor substrate 110 may be etched using the mask pattern 162 as an etch mask, resulting in formation of a trench 114'. In this case, the depth of the trench 114a' may be equal to a difference in depth between the trench 114a and the trench 114d shown in FIG. 3.

Referring to FIG. 7B, after removing the mask pattern 162, a mask pattern 164 for opening regions in which the unit pixels PXa and PXd are to be formed may be formed over the first surface of the semiconductor substrate 110. For example, the mask pattern 164 may be formed to expose not only the trench 114a' formed in the process of FIG. 7A, but also a region of the unit pixel (PXd) where the substrate should have a second thickness greater than the first thickness.

Subsequently, the semiconductor substrate 110 may be etched using the mask pattern 164 as an etch mask, resulting in formation of trenches 114a'' and 114d'. In this case, the depth of the trench 114d' may be equal to a difference in depth between the trench 114d and the 114c shown in FIG. 3, and the depth of the trench 114a'' may be equal to the sum of the depth of the trench 114a' and the depth of the trench 114d'.

That is, since the trench 114d' is formed in a state in which the trench 114a' is exposed, the trench 114a' may be additionally etched to the depth of the trench 114d' during formation of the trench 114d', resulting in formation of a trench 114a''.

Referring to FIG. 7C, after removing the mask pattern 164, a mask pattern 166 for opening regions in which the unit pixels PXa, PXc, and PXd are to be formed may be formed over the first surface of the semiconductor substrate 110. For example, the mask pattern 166 may be formed to expose not only the trenches 114a'' and 114d' formed in the process of FIG. 7B, but also a region of the unit pixel (PXc) where the substrate should have a third thickness greater than the second thickness.

Subsequently, the semiconductor substrate 110 may be etched to a depth of the trench 114c using the mask pattern 166 as an etch mask, resulting in formation of trenches 114a, 114c, and 114d. That is, since the trench 114c is formed in a state in which the trenches 114a'' and 114d' are exposed, the trenches 114a'' and 114d' may be additionally etched to the depth of the trench 114c during formation of the trench 114c, resulting in formation of the trenches 114a, 114c, and 114d.

FIG. 8 is a diagram illustrating an example of a planar structure of an image sensing device based on another embodiment of the disclosed technology.

In the above-described embodiments, in relation to each of the sub-pixel blocks PB_R, PB_Gr, PB_Gb, and PB_B within the pixel array 100, the steps S100 to S400 shown in FIG. 4 are performed to determine a substrate thickness for each of the corresponding unit pixels.

Referring to FIG. 8, the pixel array 100 may be divided into a plurality of sub-pixel arrays to vary the substrate thicknesses of the unit pixels in units of the sub-pixel array. For example, the design system may divide the pixel array into a plurality of sub-pixel arrays {R(1,1)~R(375,500)}, and the above-described steps S100 to S400 may be performed only in some sub-pixel blocks PB_R, PB_Gr, PB_Gb, and PB_B located at the center of the sub-pixel arrays {R(1,1)~R(375,500)}, so that the substrate thicknesses of the corresponding unit pixels can be determined. The sub-pixel blocks PB_R, PB_Gr, PB_Gb, and PB_B each having the same color within the same sub-pixel arrays {R(1,1)~R(375,500)} may be formed to have substrate thicknesses having the same pattern.

As is apparent from the above description, the image sensing device based on some implementations of the disclosed technology can prevent imbalance of pixel signals by adjusting a thickness of a substrate with respect to a plurality of adjacent unit pixels having the same color.

The embodiments of the disclosed technology may provide a variety of effects capable of being directly or indirectly recognized through the above-mentioned patent document.

Although a number of illustrative embodiments have been described, it should be understood that modifications or enhancements to the disclosed embodiments and other embodiments can be devised based on what is described and/or illustrated in this patent document.

What is claimed is:

1. An image sensing device comprising:
a semiconductor substrate including photoelectric conversion regions, each photoelectric conversion region generating photocharges through conversion of incident light; and
a plurality of first color filters disposed over a first surface of the semiconductor substrate to transmit incident light of a first color to the photoelectric conversion regions of first unit pixels,
wherein the first unit pixels have different substrate thicknesses from one another.

2. The image sensing device according to claim 1, wherein the plurality of first color filters is arranged adjacent to each other in an (N×N) array, where N is a natural number equal to or greater than 2.

3. The image sensing device according to claim 1, further comprising:
a plurality of second color filters arranged adjacent to each other over the first surface of the semiconductor substrate to transmit incident light of a second color to the photoelectric conversion regions of second unit pixels; and
a plurality of third color filters arranged adjacent to each other over the first surface of the semiconductor substrate to transmit incident light of a third color to the photoelectric conversion regions of third unit pixels,
wherein,
the second unit pixels have different substrate thicknesses from one another, and
the third unit pixels have different substrate thicknesses from one another.

4. The image sensing device according to claim 3, wherein the first to third color filters are arranged in a Bayer pattern.

5. The image sensing device according to claim 1, wherein the semiconductor substrate includes a plurality of trenches etched in a direction away from the first surface.

6. The image sensing device according to claim 5, wherein the plurality of trenches has different depths from one another.

7. The image sensing device according to claim 5, further comprising:
an anti-reflection layer formed between the semiconductor substrate and the plurality of first color filters and filling the plurality of trenches.

8. The image sensing device according to claim 1, wherein the first unit pixels include photoelectric conversion regions having different sizes from one another.

9. An image sensing device comprising:
a pixel array including a plurality of sub-pixel blocks, each sub-pixel block including a plurality of unit pixels configured to generate photocharges through photoelectric conversion of incident light corresponding to a certain color,
wherein,
the plurality of unit pixels of the sub-pixel block includes photoelectric conversion regions that are located within a substrate to perform the photoelectric conversion of the incident light and have different sizes from one another.

10. The image sensing device according to claim 9, wherein:
the substrate includes a plurality of trenches etched in a direction away from a surface of the substrate through which the incident light is received.

11. The image sensing device according to claim 10, wherein the plurality of trenches has different depths from one another.

12. The image sensing device according to claim 10, wherein each of the plurality of unit pixels includes an anti-reflection layer formed over the substrate and filling the plurality of trenches.

13. The image sensing device according to claim 9, wherein the plurality of sub-pixel blocks includes:
a first sub-pixel block in which a plurality of first unit pixels that generates photocharges through photoelectric conversion of incident light of a first color is arranged adjacent to each other;
a second sub-pixel block in which a plurality of second unit pixels that generates photocharges through photoelectric conversion of incident light of a second color is arranged adjacent to each other; and
a third sub-pixel block in which a plurality of third unit pixels that generates photocharges through photoelectric conversion of incident light of a third color is arranged adjacent to each other.

14. The image sensing device according to claim 13, wherein the first to third sub-pixel blocks are arranged in a Bayer pattern.

15. The image sensing device according to claim 13, wherein each of the first to third sub-pixel blocks includes a plurality of trenches.

16. The image sensing device according to claim 15, wherein the plurality of trenches has different depths from one another.

17. The image sensing device according to claim 9, wherein the photoelectric conversion regions have different thicknesses from one another.

18. The image sensing device according to claim 9, wherein:

the pixel array includes a plurality of sub-pixel arrays, and wherein, the plurality of sub-pixel blocks having a same color in each sub-pixel array are formed to have substrate thicknesses of a same pattern.

19. The image sensing device according to claim 9, wherein one of the plurality of unit pixels has a region whose depth is greater than those of regions of remaining unit pixels that are defined with corresponding trenches.

20. The image sensing device according to claim 9, wherein the plurality of unit pixels is arranged adjacent to each other in an (N×N) array, where N is a natural number equal to or greater than 2.

\*   \*   \*   \*   \*